US011398799B2

United States Patent
Balasubramanian et al.

(10) Patent No.: US 11,398,799 B2
(45) Date of Patent: *Jul. 26, 2022

(54) OFFSET DRIFT COMPENSATION

(71) Applicant: TEXAS INSTRUMENTS INCORPORATED, Dallas, TX (US)

(72) Inventors: Shyamsunder Balasubramanian, Plano, TX (US); Wenxiao Tan, Plano, TX (US); Mayank Garg, Murphy, TX (US); Toru Tanaka, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/701,502

(22) Filed: Dec. 3, 2019

(65) Prior Publication Data

US 2020/0106396 A1  Apr. 2, 2020

Related U.S. Application Data

(63) Continuation of application No. 15/934,467, filed on Mar. 23, 2018, now Pat. No. 10,530,308.

(51) Int. Cl.
*H03F 3/04* (2006.01)
*H03F 1/30* (2006.01)

(52) U.S. Cl.
CPC .......... *H03F 1/30* (2013.01); *H03F 3/04* (2013.01); *H03F 2200/375* (2013.01); *H03F 2200/447* (2013.01); *H03F 2200/528* (2013.01)

(58) Field of Classification Search
CPC ........ H03F 1/30; H03F 3/04; H03F 2200/375; H03F 2200/528; H03F 2200/447
USPC ....................................... 330/9, 289
See application file for complete search history.

(56) References Cited

U.S. PATENT DOCUMENTS

| | | | | |
|---|---|---|---|---|
| 3,887,863 A * | 6/1975 | Brokaw | ............ | G05F 3/30 323/314 |
| 5,359,552 A * | 10/1994 | Dhong | ............ | G11C 5/147 327/530 |
| 6,628,169 B2 * | 9/2003 | Ivanov | ............ | H03F 1/303 327/307 |
| 7,057,444 B2 * | 6/2006 | Illegems | ............ | G05F 1/46 323/316 |
| 7,298,201 B2 * | 11/2007 | Ogasawara | ...... | H03K 19/00384 327/543 |
| 10,530,308 B2 * | 1/2020 | Balasubramanian | ..... | H03F 3/04 |

* cited by examiner

*Primary Examiner* — Khanh V Nguyen
*Assistant Examiner* — Khiem D Nguyen
(74) *Attorney, Agent, or Firm* — Ray A. King; Charles A. Brill; Frank D. Cimino

(57) ABSTRACT

An offset drift compensation circuit for correcting offset drift that changes with temperature. In one example, offset drift compensation circuit includes a low temperature offset compensation circuit and a high temperature offset circuit. The low temperature offset compensation circuit is configured to compensate for drift in offset at a first rate below a selected temperature. The high temperature offset compensation circuit is configured to compensate for drift in offset at a second rate above the selected temperature. The first rate is different from the second rate.

10 Claims, 7 Drawing Sheets

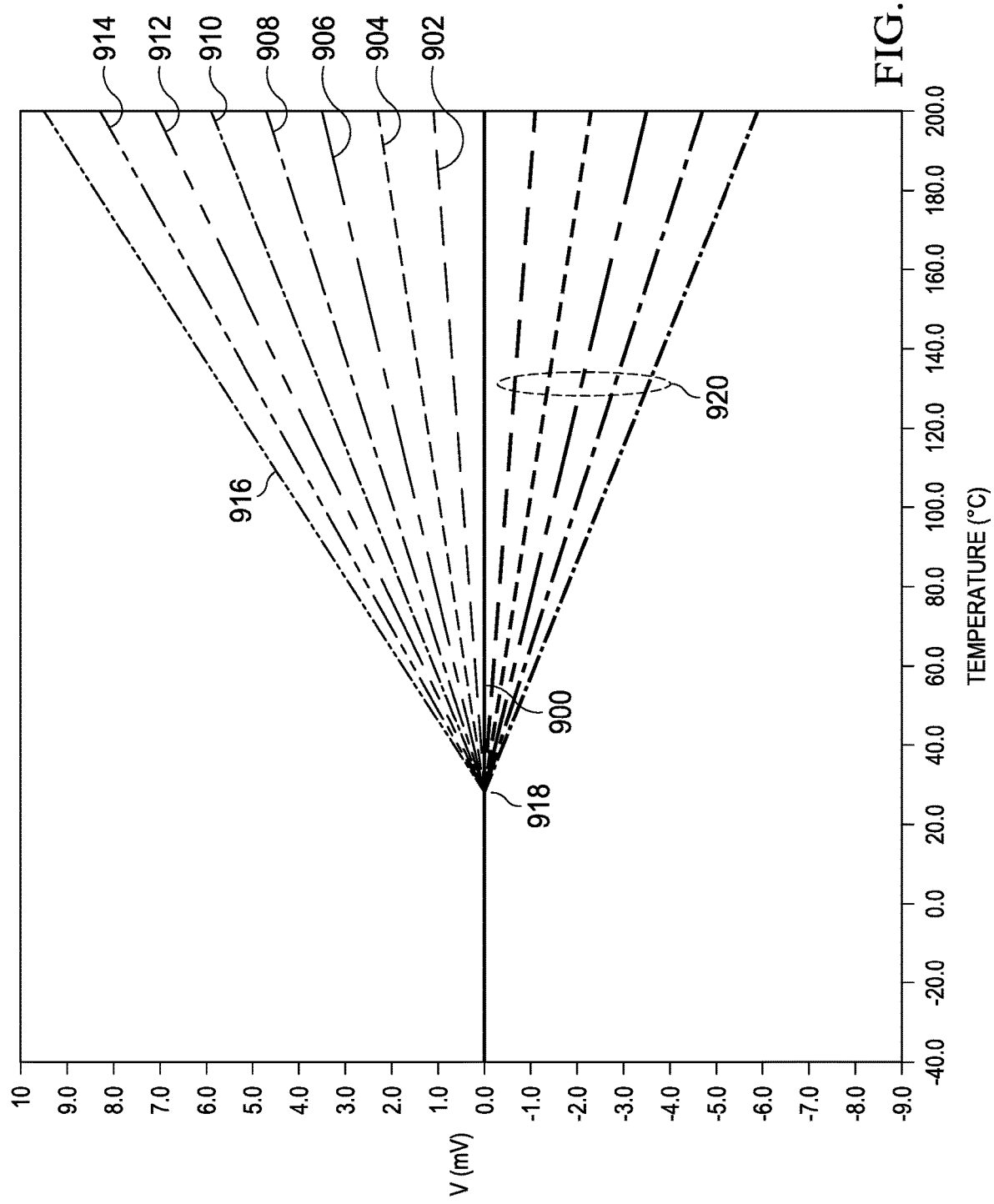

OFFSET DRIFT COMPENSATION

CROSS-REFERENCE TO RELATED APPLICATION(S)

This continuation application claims priority to U.S. patent application Ser. No. 15/934,467, filed Mar. 23, 2018, which is incorporated herein by reference in its entirety.

BACKGROUND

Various analog circuits, amplifiers for example, suffer from offset error. Offset error results from mismatch of circuit components. For example, mismatch of differential input transistors can cause an amplifier to produce a non-zero output voltage when the amplifier input voltage is zero. Offset error can detrimentally affect the operation of a circuit receiving a signal that includes an offset voltage. Attempts are made to minimize offset error in a variety applications. However, even after compensating for offset error, the factors that produce the offset error can vary with temperature, causing a variation in the offset error with temperature. Such variation is referred to as "offset drift."

SUMMARY

Offset drift compensation circuits that correct for offset that changes with temperature are disclosed herein. In one example, an offset drift compensation circuit includes a low temperature offset compensation circuit and a high temperature offset compensation circuit. The low temperature offset compensation circuit is configured to compensate for drift in offset at a first rate below a selected temperature. The high temperature offset compensation circuit is configured to compensate for drift in offset at a second rate above the selected temperature. The first rate is different from the second rate.

In another example, an amplifier includes an amplification stage and an offset drift compensation circuit. The offset drift compensation circuit is coupled to the amplification stage. The offset drift compensation circuit is configured to provide an offset compensation current to the amplification stage. The offset compensation current cancels offset generated by the amplification stage that changes with temperature. The offset compensation current changes at a first rate responsive to temperature above a selected temperature. The offset compensation current changes at a second rate responsive to temperature below the selected temperature.

In a further example, an asymmetric offset drift compensation circuit includes a low temperature offset compensation circuit and a high temperature offset circuit. The low temperature offset compensation circuit includes first bandgap voltage circuit, and a first base-emitter voltage circuit. Current flows through the first bandgap voltage circuit to the first base-emitter voltage circuit. Current flowing through the first bandgap voltage circuit is set to cause the low temperature offset compensation circuit to generate a first offset compensation ramp voltage starting at a first temperature. The high temperature offset compensation circuit includes a second bandgap voltage circuit, and a second base-emitter voltage circuit. Current flows through the second base-emitter voltage circuit to the second bandgap voltage circuit. Current flowing through the second bandgap voltage circuit is set to cause the high temperature offset compensation circuit to generate a second offset compensation ramp voltage starting at a second temperature.

BRIEF DESCRIPTION OF THE DRAWINGS

For a detailed description of various examples, reference will now be made to the accompanying drawings in which:

FIG. 9 shows examples of offset correction produced by a high temperature offset drift compensation circuit in accordance with the present disclosure.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

To compensate for circuit offset, the offset is measured and under known conditions (e.g., at an optimal operating temperature), and subtracted from the output of the circuit during operation. Unfortunately, such compensation does not correct for offset drift over temperature. To compensate for offset drift, some circuits determine the slope of offset over temperature and apply the slope to compensate for offset drift. Such compensation cannot correct for second order effects that are caused by mechanical stress related to temperature or other temperature related effects. Other circuits apply digital correction that selects a trim value based on measured temperature. Such correction can produce undesirable discontinuities in an analog signal.

The present disclosure includes offset drift correction circuitry that independently trims offset drift at high temperatures and low temperatures without discontinuities and without affecting the offset at room temperature. Implementations of the circuits disclosed herein provide offset drift correction for analog circuitry that is affected by package stress or in which offset changes with bias conditions leading to different offset drift at high temperatures relative to low temperatures.

Figure 1:
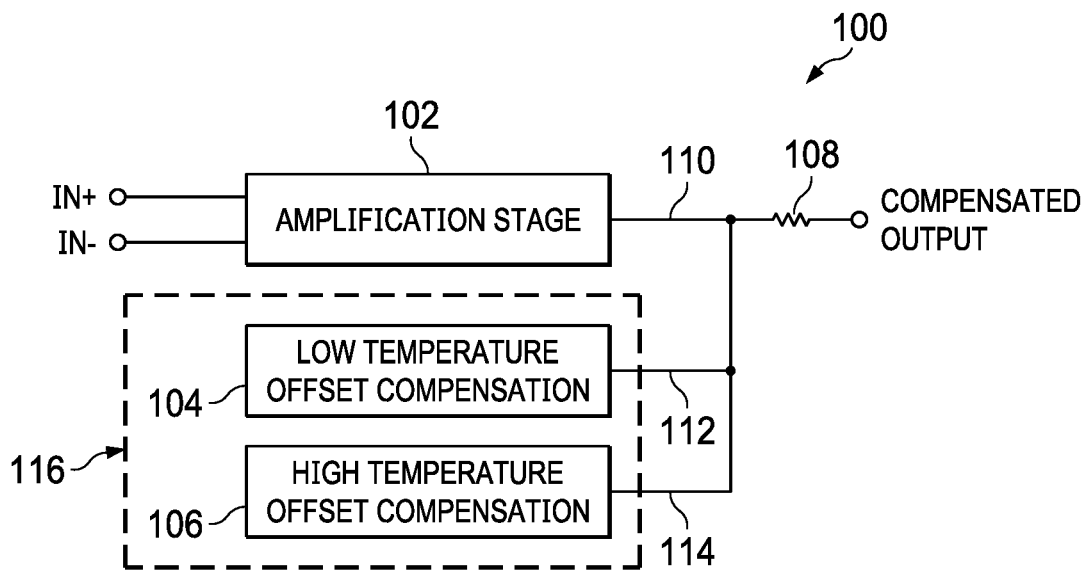
FIG. 1 shows a block diagram for an example of an amplifier that includes offset drift compensation in accordance with the present disclosure.

FIG. 1 shows a block diagram for an example of an amplifier 100 that includes offset drift compensation in accordance with the present disclosure. The amplifier 100 includes an amplification stage 102, a low temperature offset compensation circuit 104, a high temperature offset compensation circuit 106, and a resistor 108. While a single amplification stage 102 is illustrated in FIG. 1, some implementations of the amplifier 100 include multiple amplification stages. The amplification stage 102 receives as input a differential signal IN+/IN−, and applies a gain to the received signal to produce an output signal 110. The output signal 110 is a current that produces an output voltage of the amplification stage 102 across the resistor 108. The amplification stage 102 (via the output signal 110) also generates an offset voltage across the resistor 108. The offset voltage varies with the temperature of the amplifier 100.

To compensate for the temperature variable offset produced by the amplification stage 102, the amplifier 100 includes the low temperature offset compensation circuit 104 and the high temperature offset compensation circuit 106. The low temperature offset compensation circuit 104 and the high temperature offset compensation circuit 106 form an asymmetric offset drift compensation circuit 116 that is coupled to the amplification stage 102. The low temperature offset compensation circuit 104 and the high temperature offset compensation circuit 106 are coupled to the resistor 108, and produce a voltage drop across the resistor 108 that compensates for the offset generated by the amplification stage 102. Below a selected temperature the low temperature offset compensation circuit 104 generates a cold trim current 112 that produces an offset compensation voltage across the resistor 108, and above the selected voltage, the high temperature offset compensation circuit 106 generates a current that produces an offset compensation voltage across the resistor 108. Above the selected voltage, the low temperature offset compensation circuit 104 does not generate a cold trim current 112 that produces an offset compensation voltage across the resistor 108, and below the selected voltage, the high temperature offset compensation circuit 106 does not generate a hot trim current 114 that produces an offset compensation voltage across the resistor 108.

In some implementations, the rate of change of the offset compensation produced by the low temperature offset compensation circuit 104 is different from the rate of change of the offset compensation produced by the high temperature offset compensation circuit 106 to compensate for varying rates of change in the offset produced by the amplification stage 102 over temperature. While the amplifier 100 is illustrated in FIG. 1 as included one low temperature offset compensation circuit 104 and one high temperature offset compensation circuit 106, some implementations of the amplifier 100 include more than one low temperature offset compensation circuit 104 and/or more than one high temperature offset compensation circuit 106, where each low temperature offset compensation circuit 104 and high temperature offset compensation circuit 106 compensates for a different rate of change in the offset produced by the amplification stage 102 over temperature.

While FIG. 1 illustrates use of the low temperature offset compensation circuit 104 and the high temperature offset compensation circuit 106 to provide offset drift compensation to an amplification stage 102, implementations of the low temperature offset compensation circuit 104 and the high temperature offset compensation circuit 106 are applicable to various electronic circuits that are subject to offset drift. For example, the low temperature offset compensation circuit 104 and high temperature offset compensation circuit 106 are applicable to compensate for offset drift in a comparator circuit.

Figure 2:
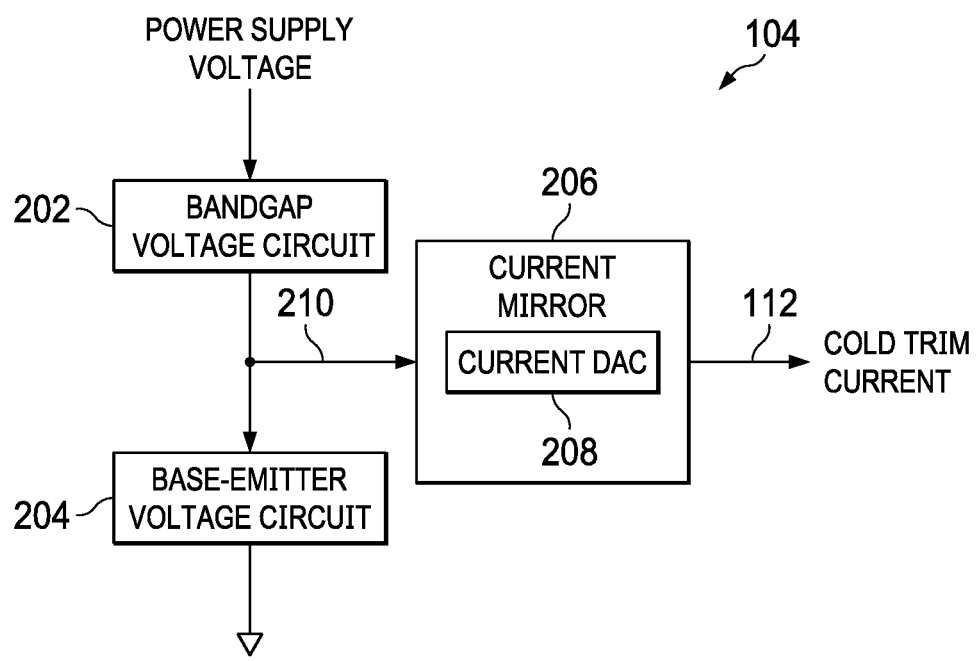
FIG. 2 shows a block diagram for an example of a low temperature offset drift compensation circuit in accordance with the present disclosure.

FIG. 2 shows a block diagram for an example of the low temperature offset compensation circuit 104 in accordance with the present disclosure. The low temperature offset compensation circuit 104 includes a band-gap voltage circuit 202, a base-emitter voltage circuit 204, and a current mirror 206. The current mirror 206 includes a current output digital-to-analog converter 208. The band-gap voltage circuit 202 is coupled to a power supply. The base-emitter voltage circuit 204 is coupled to a current output of the band-gap voltage circuit 202. The band-gap voltage circuit 202 includes transistors and other electronic components, and generates a current output that is generally constant with respect to temperature. For example, the band-gap voltage circuit 202 generates a current as a function of bandgap voltage ($V_{bg}$), which is generally constant with respect to temperature.

Figure 3:
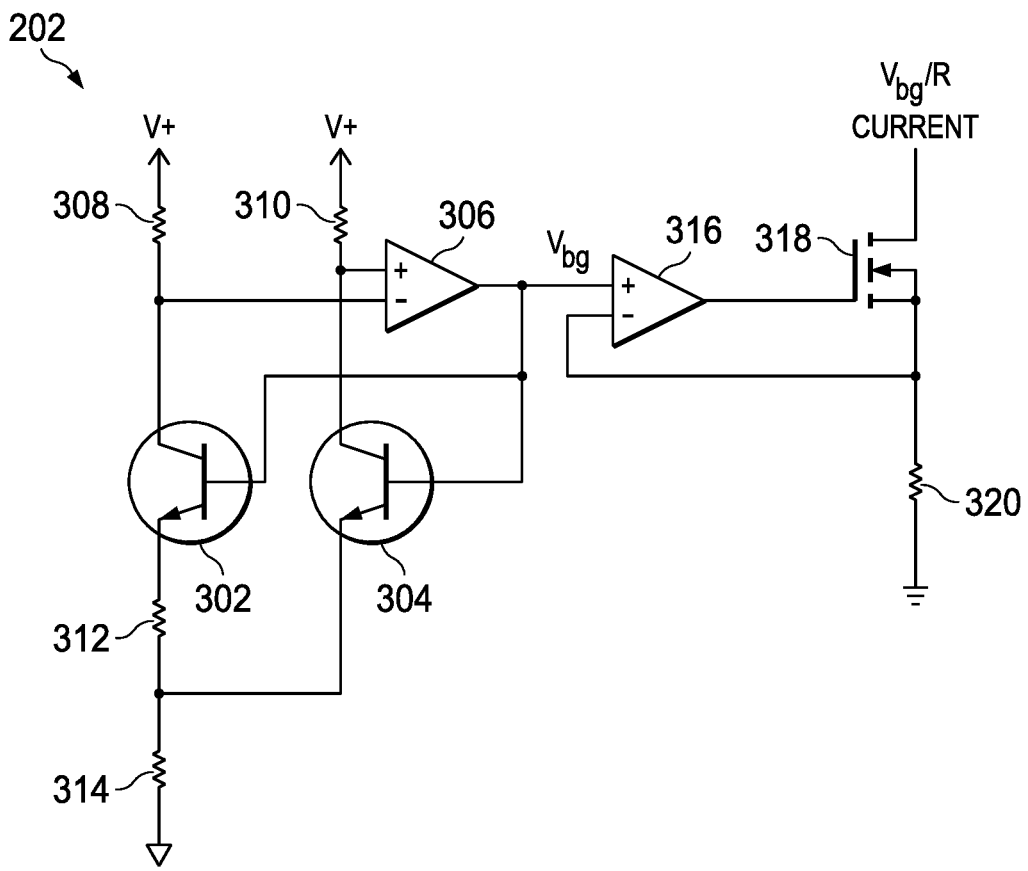
FIG. 3 shows a schematic diagram for an example of a bandgap voltage circuit in accordance with the present disclosure.

FIG. 3 show a schematic for an example of the band-gap voltage circuit 202. The illustrated example of the 202 includes bipolar transistors 302 and 304, amplifier 306 and resistors 308, 310, 312, and 314 arranged to generate $V_{bg}$ and amplifier 316, transistor 318, and resistor 320 to generate a current proportional to $V_{bg}$. The transistor 302 may be an N-emitter version of the transistor 304. The collectors of the transistors 302 and 304 are coupled to a voltage source via the resistors 308 and 310 respectively. The amplifier 306 drives the bases of the transistors 302 and 304 to equalize the collector currents of the transistors 302 and 304. The voltages across resistors 312 and 314 are proportional to absolute temperature (PTAT), and the base-emitter voltage of transistor 304 is complementary to absolute temperature (CTAT). The PTAT voltage across resistor 314 is scaled to be complementary to the CTAT voltage ($V_{be}$ of transistor 304). The voltage output of the amplifier 306 is a sum of the CTAT voltage and scaled PTAT voltage, and is constant with temperature. The amplifier 316, the transistor 318, and the resistor 320 are coupled to convert $V_{bg}$ output by the amplifier 306 to a current $V_{bg}/R$.

The base-emitter voltage circuit 204 includes transistors and other electronic components, and generates a base-emitter voltage ($V_{be}$) and a corresponding current that varies approximately linearly as a function of temperature. The signal 210 is the difference of the bandgap voltage generated by the band-gap voltage circuit 202 and the base-emitter voltage generated by the base-emitter voltage circuit 204 (e.g., the signal 210 is $V_{bg}-V_{be}$).

Figure 4:
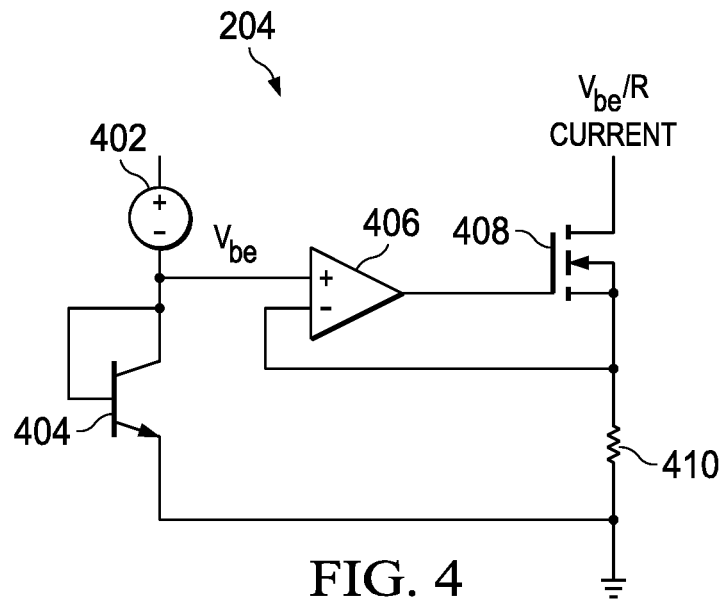
FIG. 4 shows a schematic diagram for an example of a base-emitter voltage circuit in accordance with the present disclosure.

FIG. 4 shows a schematic diagram for an example of the base-emitter voltage circuit 204. The illustrated example of the base-emitter voltage circuit 204 includes a current source 402, a transistor 404 to generate the base-emitter voltage $V_{be}$, and an amplifier 406, a transistor 408, and a resistor 410 to convert $V_{be}$ to a proportional current. The transistor 404 is connected as a diode with the emitter connected to ground. The voltage at the base of the transistor 404 varies as a function of temperature. The amplifier 406, the transistor 408, and the resistor 410 are coupled to convert $V_{be}$ generated by the transistor 404 to a current $V_{be}/R$.

The signal 210 drives the current mirror 206. The output of the current mirror 206 is the cold trim current 112 that compensates for offset drift when converted to a voltage across the resistor 108. The current mirror 206 includes the current output digital-to-analog converter 208 to set the slope (i.e., the rate of change) of an offset compensation ramp current of the cold trim current 112. For example, an implementation of the current output digital-to-analog converter 208 includes a plurality of transistors that are switchable to provide current through the current mirror 206 to the cold trim current 112. The greater the number of transistors, or the larger the transistors, selected the greater the current flowing into the current mirror 206 and the greater the slope of the cold trim current 112 generated based on the signal 210.

Figure 5:
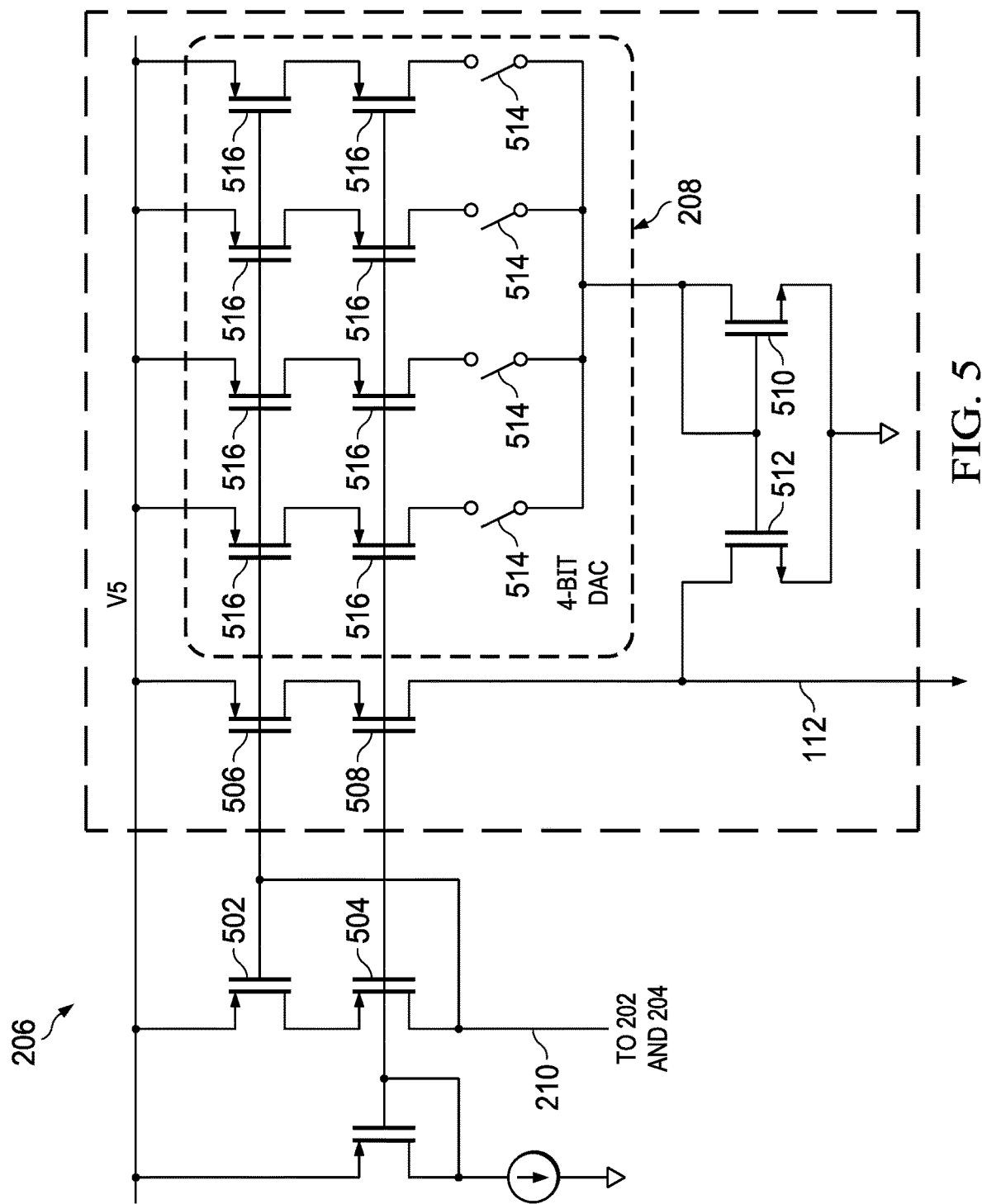
FIG. 5 shows a schematic diagram for an example of a current mirror circuit in accordance with the present disclosure.

FIG. 5 shows an example of the current mirror 206. The current mirror 206 includes transistor 502, 504, 506, 508, 510, 512, and the current output digital-to-analog converter 208, which includes a number of transistors 516 and switches 514. Current flowing in the transistors 502 and 504 is a function of the currents generated by the bandgap voltage circuit 202 and the base-emitter voltage circuit 204, and is reflected in the current flowing in the transistors 506 and 508. In the current output digital-to-analog converter 208, the switches 516 are selectably opened or closed (e.g., during manufacturing trim of the amplifier 100) to set the current flowing into the transistor 510 and set the slope of the cold trim current 112. The transistors 510 and 512 are coupled as a current mirror, wherein the current flowing in the transistor 510 is reflected in the transistor 512.

Figure 6:
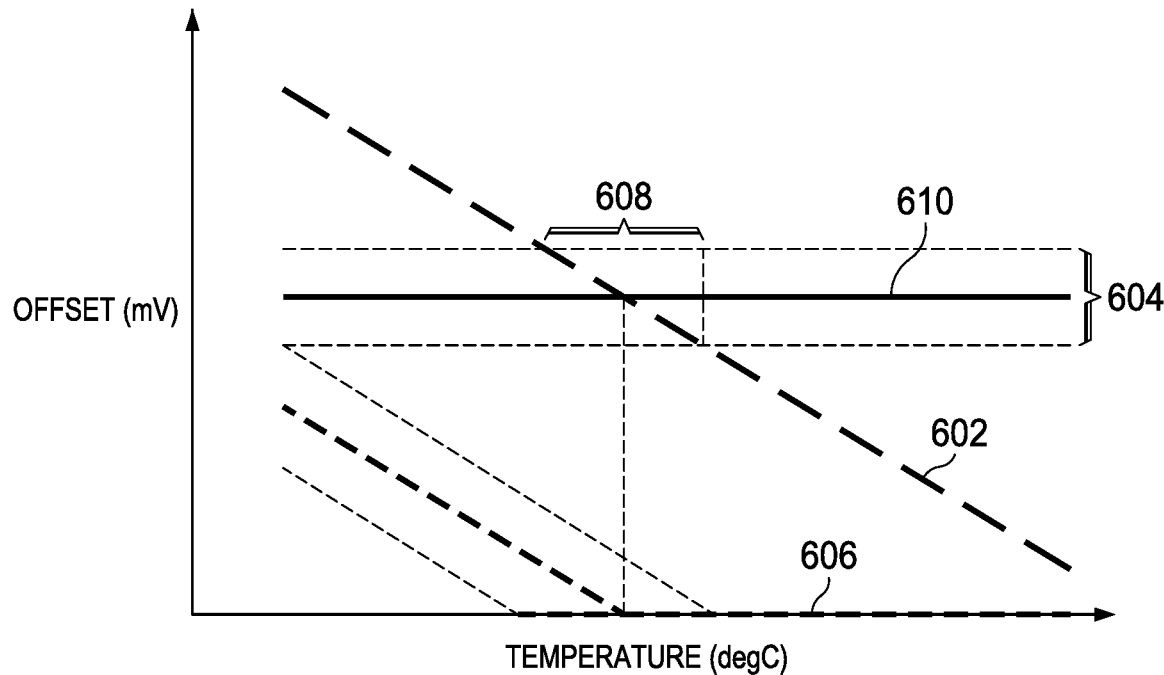
FIG. 6 shows an example of setting a knee point in an offset drift compensation circuit in accordance with the present disclosure.

In manufacture, the circuitry of the low temperature offset compensation circuit 104 is adjusted (trimmed) to control the offset drift compensation provided at low temperatures. For example, an implementation of the band-gap voltage circuit 202 includes a digital-to-analog converter that adjusts the output of the band-gap voltage circuit 202 to set the voltage at which the base-emitter voltage circuit 204 output exceeds the band-gap voltage circuit 202 output. The voltage at which the base-emitter voltage circuit 204 output exceeds the band-gap voltage circuit 202 output corresponds to a selected temperature value because the base-emitter voltage circuit 204 output varies with temperature. Such adjustment may be referred to as setting a "knee point" in the cold trim current 112 because at temperatures above the knee point the low temperature offset compensation circuit 104 has no effect on offset drift, and at temperatures below the knee point the low temperature offset compensation circuit 104 compensates for offset drift as a function of temperature. FIG. 6 shows an example of setting the knee point in the low temperature offset compensation circuit 104 in accordance with the present disclosure. In FIG. 6, $V_{bg}$ 610 is constant across temperature, and is adjustable in a range 604. $V_{be}$ 402 varies with temperature. The temperature at which $V_{be}$ 602 intersects $V_{bg}$ 610 is the knee point temperature. Accordingly, by adjusting $V_{bg}$ 610 over the range 604, the knee point temperature is adjustable over the range 608. The cold trim current 112 is represented by the signal 606, which shows that at temperatures below the knee point temperature the cold trim current 112 compensates for offset drift as a function of the $V_{be}$ 602, and at temperatures above the knee point temperature, the cold trim current 112 does not compensate for offset drift. Accordingly, room temperature offset compensation applies at temperatures above the knee point, and the knee point is set provide offset drift compensation at temperatures below those at which the room temperature offset compensation is effective.

Figure 7:
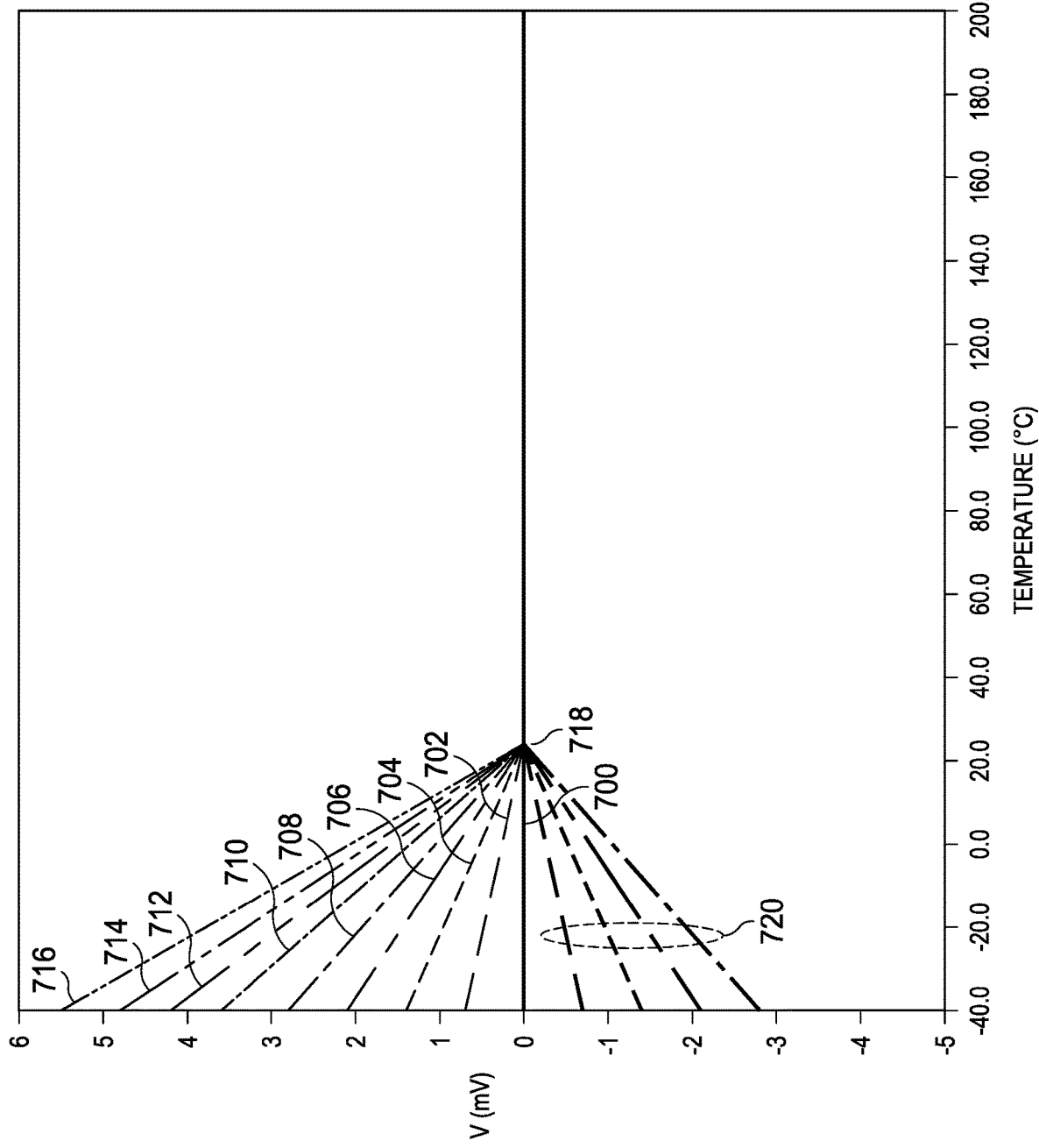
FIG. 7 shows examples of offset correction produced by a low temperature offset drift compensation circuit in accordance with the present disclosure.

In addition to the temperate at which offset drift compensation is applied (i.e., the knee point temperature), the low temperature offset compensation circuit 104 is trimmed to set the slope of the offset drift compensation. Referring again to FIG. 4, the slope of the signal 606 is a function of the slope of the signal $V_{be}$ 602. To compensate for the rate of change of the offset drift of the amplification stage 102, the current output digital-to-analog converter 208 is used to vary the slope of the cold trim current 112 generated by the current mirror 206 as a function of the signal 210. In manufacture, the rate of change of the offset drift of the amplification stage 102 is measured with decreasing temperature and the current output digital-to-analog converter 208 is set to generate a current in the current mirror 206 that produces a cold trim current 112 that best cancels the offset drift with decreasing temperature. FIG. 7 shows examples of offset correction produced by the low temperature offset compensation circuit 104. At temperature 718 (the knee point) and below, the low temperature offset compensation circuit 104 begins to compensate for offset drift. Using the current output digital-to-analog converter 208, any one of a variety of compensation slopes is selectable to best compensate for the offset drift produced by the amplification stage 102. In FIG. 7, the current output digital-to-analog converter 208 selectably provides eight compensation slopes 702, 704, 706, 708, 710, 712, 714, and 716 in addition to the zero slope 700. Implementations of the current mirror 206 apply inversion to produce slopes 720 based on the slopes 702, 704, 706, 708, 710, 712, 714, and 716. Some implementations of the current mirror 206 include a current output digital-to-analog converter 208 that produces a different number of compensation slopes.

Figure 8:
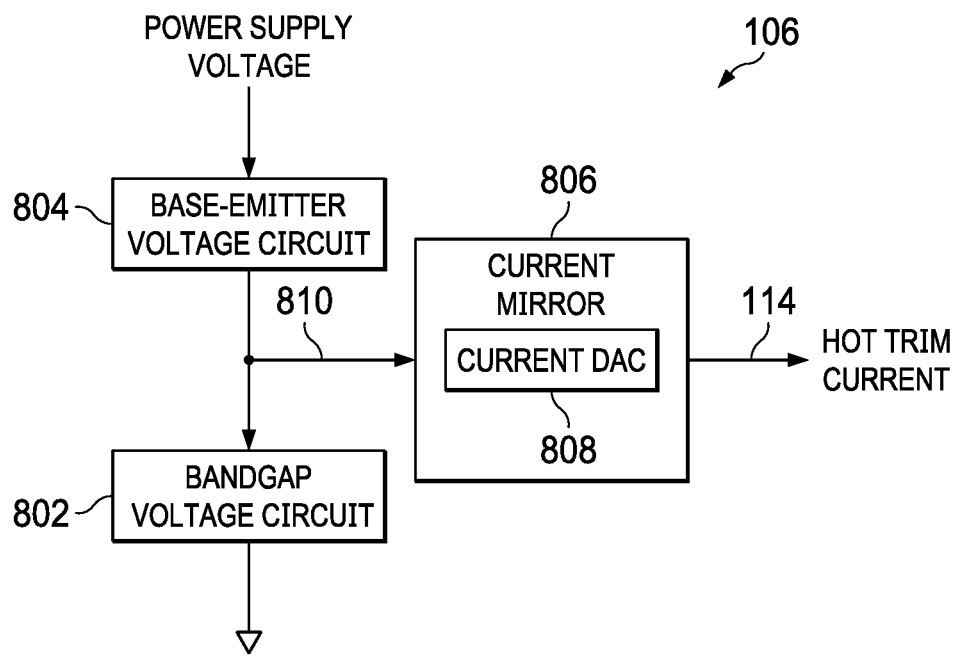
FIG. 8 shows a block diagram for an example of a high temperature offset drift compensation circuit in accordance with the present disclosure.

FIG. 8 shows a block diagram for an example of a high temperature offset compensation circuit 106 in accordance with the present disclosure. The high temperature offset compensation circuit 106 includes a band-gap voltage circuit 802, a base-emitter voltage circuit 804, and a current mirror 806. In some implementations of the 104, the band-gap voltage circuit 802 is similar to the band-gap voltage circuit 202, the base emitter voltage circuit 304 is similar to the base emitter voltage circuit 204, and the current mirror 806 is similar to the current mirror 206. The current mirror 806 includes a current output digital-to-analog converter 808. The base-emitter voltage circuit 804 is coupled to a power supply. The band-gap voltage circuit 802 is coupled to a current output of the base-emitter voltage circuit 804. The band-gap voltage circuit 802 includes transistors and other electronic components, and generates a current output that is generally constant with respect to temperature. For example, the band-gap voltage circuit 802 generates a current as a function of bandgap voltage ($V_{bg}$), which is generally constant with respect to temperature.

The base-emitter voltage circuit 804 includes transistors and other electronic components, and generates a base-emitter voltage ($V_{be}$) and a corresponding current that varies approximately linearly as a function of temperature. The signal 810 is the difference of the bandgap voltage generated by the band-gap voltage circuit 802 the base-emitter voltage generated by the base-emitter voltage circuit 804 (e.g., the signal 810 is $V_{be}-V_{bg}$).

The signal 810 drives the current mirror 806. The output of the current mirror 806 is the hot trim current 114 that compensates for offset drift when converted to a voltage across the resistor 108. The current mirror 806 includes the current output digital-to-analog converter 808 to set the slope (i.e., the rate of change) of an offset compensation ramp current of the hot trim current 114. For example, implementations of the current output digital-to-analog converter 808 include a plurality of transistors that are switchable to provide current through the current mirror 806 to the hot trim current 114. The greater the number of transistors, or the larger the transistors, selected the greater the current flowing into the current mirror 806 and the greater the slope of the hot trim current 114 generated based on the signal 810.

In manufacture, the circuitry of the high temperature offset compensation circuit 106 is adjusted (trimmed) to control the offset drift compensation provided at high temperatures. For example, implementations of the band-gap voltage circuit 802 include a digital-to-analog converter that adjusts the output of the band-gap voltage circuit 802 to set the voltage at which the base-emitter voltage circuit 804 output exceeds the band-gap voltage circuit 802 output. The voltage at which the base-emitter voltage circuit 804 output exceeds the band-gap voltage circuit 802 output corresponds to a selected temperature value because the base-emitter voltage circuit 804 output varies with temperature. Such adjustment may be referred to as setting a "knee point" in the hot trim current 114 because at temperatures below the knee point the high temperature offset compensation circuit 106 has no effect on offset drift, and at temperatures above the knee point the high temperature offset compensation circuit 106 compensates for offset drift as a function of temperature. Setting of the knee point temperature in the high temperature offset compensation circuit 106 is performed as described with respect to the low temperature offset compensation circuit 104. The output of the band-gap voltage circuit 802 is adjusted to set the temperature at which $V_{be}$ intersects $V_{bg}$. At temperatures below the knee point temperature the hot trim current 114 compensates for offset drift as a function of $V_{be}$, and at temperatures above the knee point temperature, the hot trim current 114 does not compensate for offset drift. Accordingly, room temperature offset compensation applies at temperatures below the knee point, and the knee point is set provide offset drift compensation at temperatures above those at which the room temperature offset compensation is effective. In some implementations, the knee point temperature selected for the high temperature offset compensation circuit 106 is different than the knee point temperature selected for the low temperature offset compensation circuit 104. For example, the knee point temperature selected for the high temperature offset compensation circuit 106 may be any number of degrees higher than the knee point temperature selected for the low temperature offset compensation circuit 104, with room temperature offset compensation applied in the range between the knee point temperature selected for the high temperature offset compensation circuit 106 and the knee point temperature selected for the low temperature offset compensation circuit 104

In addition to the temperate at which offset drift compensation is applied, the high temperature offset compensation circuit 106 is trimmed to set the slope of the offset drift compensation. To compensate for the rate of change of the offset drift of the amplification stage 102, the current output digital-to-analog converter 808 is used to vary the slope of the hot trim current 114 generated by the current mirror 806 as a function of the signal 810. In manufacture, the rate of change of the offset drift of the amplification stage 102 is measured with increasing temperature and the current output digital-to-analog converter 808 is set to generate a current in the current mirror 806 that produces a hot trim current 114 that best cancels the offset drift with increasing temperature. FIG. 9 shows examples of offset correction produced by the low temperature offset compensation circuit 104. At temperature 918 (the knee point) and above, low temperature offset compensation circuit 104 begins to compensate for offset drift. Any one of a variety of compensation slopes is selectable to best compensate for the offset drift produced by the amplification stage 102. In FIG. 9, the current output digital-to-analog converter 808 selectably provides eight compensation slopes 902, 904, 906, 908, 910, 912, 914, and 916 in addition to the zero slope 900. Some implementations of the current mirror 806 apply inversion to produce slopes 920 based on the slopes 902, 904, 906, 908, 910, 912, 914, and 916. Some implementations of the current mirror 806 include a current output digital-to-analog converter 808 that produces a different number of compensation slopes.

Figure 10:
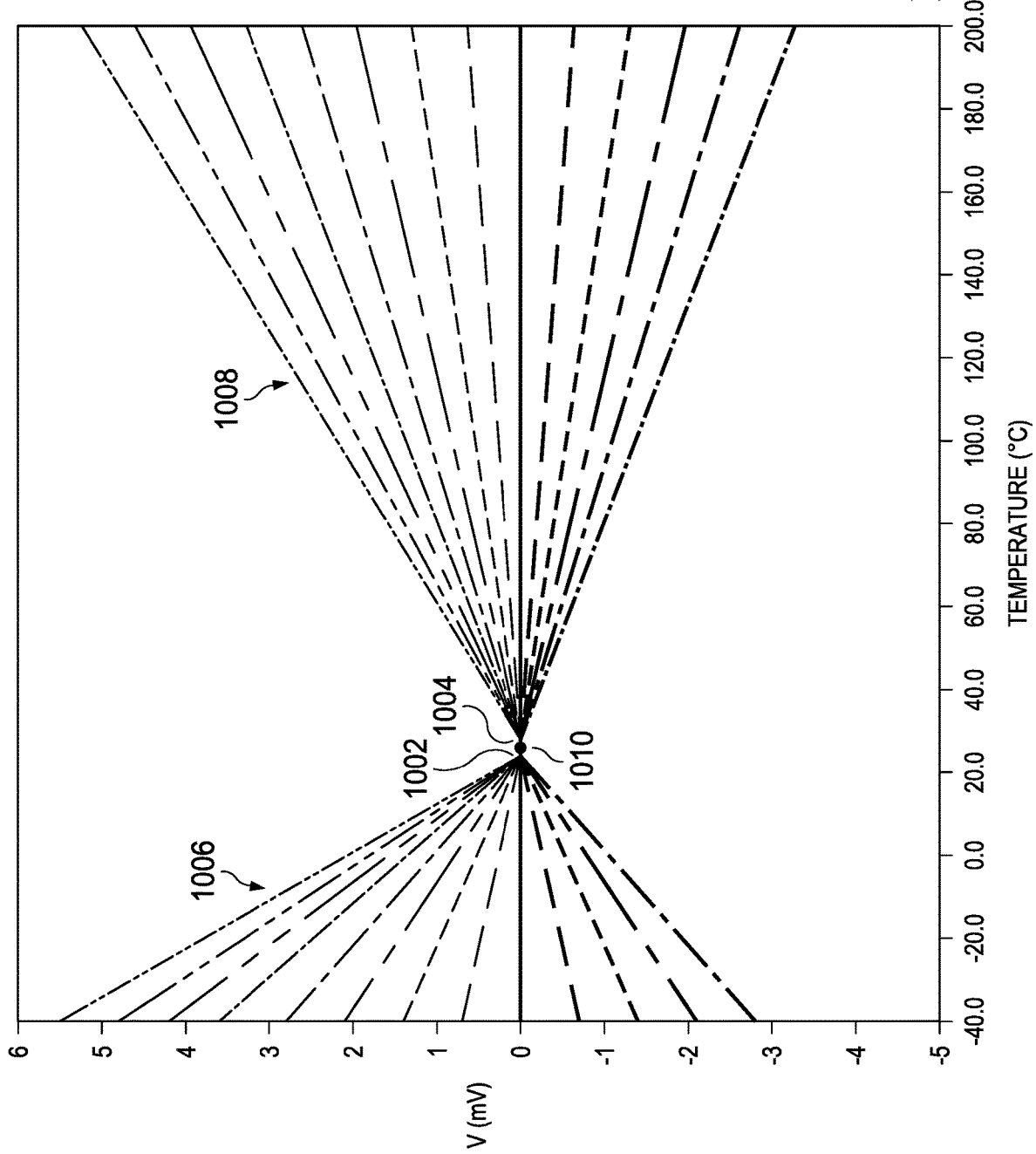
FIG. 10 shows examples of offset correction produced by a low temperature offset drift compensation circuit and a high temperature offset drift compensation circuit in accordance with the present disclosure.

FIG. 10 shows examples of offset drift correction produced by the low temperature offset compensation circuit 104 and the high temperature offset compensation circuit 106 in accordance with the present disclosure. In FIG. 10, a temperature corresponding to the knee point 1002 is selected for the low temperature offset compensation circuit 104, and a temperature corresponding to knee point 1004 is selected for the high temperature offset compensation circuit 106. At temperatures between the knee point 1002 and the knee point 1004 (e.g., at room temperature 1010), the low temperature offset compensation circuit 104 and the high temperature offset compensation circuit 106 provide no offset drift compensation and a room temperature offset compensation is applied. At temperatures below the knee point 1002, the low temperature offset compensation circuit 104 generates the cold trim current 112, which includes one of the offset drift compensation ramp voltages 1006 selected to best correct low temperature offset drift generated by the amplification stage 102. At temperatures above the knee point 1004, the high temperature offset compensation circuit 106 generates the hot trim current 114, which corresponds to one of the offset drift compensation ramp voltages 1008 selected to best correct high temperature offset drift generated by the amplification stage 102.

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. An offset drift compensation circuit, comprising:
    a low temperature offset compensation circuit configured to compensate for drift in offset; and
    a high temperature offset compensation circuit configured to compensate for drift in offset;
    wherein the low temperature offset compensation circuit is configured to:
        provide an offset compensation ramp voltage in response to a temperature of the offset drift compensation circuit being less than or equal to a first temperature; and
        provide a fixed offset compensation voltage in response to the temperature of the offset drift compensation circuit being above the first temperature.

2. The offset drift compensation circuit of claim 1, in which the low temperature offset compensation circuit includes a bandgap voltage circuit and a base-emitter voltage circuit, wherein:
    a current flows through the bandgap voltage circuit to the base-emitter voltage circuit; and the current flowing through the bandgap voltage circuit is set to determine the first temperature.

3. The offset drift compensation circuit of claim 2, in which the bandgap voltage circuit includes:
a first transistor having first and second current terminals and a first control terminal, in which the first current terminal is coupled to a positive voltage supply terminal through a first resistor, and the second current terminal is coupled to a ground terminal through a second resistor;
a second transistor having third and fourth current terminals and a second control terminal, in which the third current terminal is coupled to the positive voltage supply terminal through a third resistor, and the fourth current terminal is coupled to the ground terminal through the second resistor; and
an amplifier having a first and second inputs and an output, wherein the first input is coupled to the first current terminal, and the second input is coupled to the third current terminal.

4. The offset drift compensation circuit of claim 1, including a current mirror circuit coupled to the low temperature offset compensation circuit and to the high temperature offset circuit.

5. An offset drift compensation circuit, comprising:
a low temperature offset compensation circuit configured to compensate for drift in offset; and
a high temperature offset compensation circuit configured to compensate for drift in offset;
wherein the high temperature offset compensation circuit is configured to:
generate an offset compensation ramp voltage responsive to a temperature of the offset drift compensation circuit being higher than or equal to a second temperature; and
generate a fixed offset compensation voltage responsive to the temperature of the offset drift compensation circuit being below the second temperature.

6. The offset drift compensation circuit of claim 5, in which the high temperature offset compensation circuit includes a bandgap voltage circuit and a base-emitter voltage circuit, in which:
a current flows through the base-emitter voltage circuit to the bandgap voltage circuit; and
the current flowing through the bandgap voltage circuit is set to determine the second temperature.

7. The offset drift compensation circuit of claim 6, in which the bandgap voltage circuit includes:
a first transistor having first and second current terminals and a first control terminal, in which the first current terminal is coupled to a positive voltage supply terminal through a first resistor, and the second current terminal is coupled to a ground terminal through a second resistor;
a second transistor having third and fourth current terminals and a second control terminal, in which the third current terminal is coupled to the positive voltage supply terminal through a third resistor, and the fourth current terminal is coupled to the ground terminal through the second resistor; and
an amplifier having a first and second inputs and an output, wherein the first input is coupled to the first current terminal, and the second input is coupled to the third current terminal.

8. The offset drift compensation circuit of claim 5, including:
a first current digital to analog converter configured to set a rate of change of the offset compensation ramp voltage starting at the first temperature; and
a second current digital to analog converter configured to set a rate of change of the offset compensation ramp voltage starting at the second temperature.

9. A bandgap voltage circuit comprising:
a first transistor having first and second transistor current terminals and a first control terminal;
a first resistor having first and second resistor terminals, the first resistor terminal connected to a voltage supply terminal, and the second resistor terminal connected to the first transistor current terminal;
a second resistor having third and fourth resistor terminals, the third resistor terminal connected to the second transistor current terminal;
a second transistor having third and fourth transistor current terminals and a second control terminal, in which the fourth transistor current terminal is connected to the fourth resistor terminal
a third resistor having fifth and sixth resistor terminals, the fifth resistor terminal connected to the fourth resistor terminal, and the sixth resistor terminal connected to a ground terminal;
a fourth resistor having seventh and eighth resistor terminals, the seventh resistor terminal connected to the voltage supply terminal, and the eighth resistor terminal connected to the third transistor current terminal;
a first amplifier having first and second amplifier inputs and a first amplifier output, wherein the first amplifier input is connected to the first transistor current terminal, the second amplifier input is connected to the third transistor current terminal, and the first amplifier output is coupled to the first and second control terminals;
a second amplifier having third and fourth amplifier inputs and a second amplifier output, wherein the third amplifier input is connected to the first amplifier output;
a third transistor having fifth and sixth transistor current terminals and a third control terminal, wherein the fifth transistor current terminal is configured to provide a current that is proportional to a voltage at the first amplifier output, the sixth transistor current terminal is coupled to the fourth amplifier input, and the third control input is coupled to the second amplifier output; and
a fifth resistor having ninth and tenth resistor terminals, wherein the ninth resistor terminal is connected to the sixth transistor current terminal, and the tenth resistor terminal is connected to the ground terminal.

10. The bandgap voltage circuit of claim 9, wherein the first and second transistors are bipolar junction transistors, and the third transistor is a MOSFET.

* * * * *